US011922713B2

(12) United States Patent
Yeke Yazdandoost et al.

(10) Patent No.: US 11,922,713 B2
(45) Date of Patent: Mar. 5, 2024

(54) UNDER-DISPLAY OPTICAL FINGERPRINT SENSOR WITH NFV COLLIMATOR AND TFT/ORGANIC IMAGER

(71) Applicant: Apple Inc., Cupertino, CA (US)

(72) Inventors: Mohammad Yeke Yazdandoost, San Jose, CA (US); Giovanni Gozzini, Berkeley, CA (US); Dale Setlak, Merritt Island, FL (US)

(73) Assignee: APPLE INC., Cupertino, CA (US)

( * ) Notice: Subject to any disclaimer, the term of this patent is extended or adjusted under 35 U.S.C. 154(b) by 141 days.

(21) Appl. No.: 16/767,887

(22) PCT Filed: Jul. 2, 2019

(86) PCT No.: PCT/US2019/040355
§ 371 (c)(1),
(2) Date: May 28, 2020

(87) PCT Pub. No.: WO2020/068242
PCT Pub. Date: Apr. 2, 2020

(65) Prior Publication Data
US 2021/0019017 A1    Jan. 21, 2021

Related U.S. Application Data

(60) Provisional application No. 62/737,818, filed on Sep. 27, 2018.

(51) Int. Cl.
*G06V 40/13*   (2022.01)
*G06F 3/042*   (2006.01)
(Continued)

(52) U.S. Cl.
CPC ........ *G06V 40/1318* (2022.01); *G06F 3/0421* (2013.01); *H10K 30/80* (2023.02); *H10K 50/30* (2023.02)

(58) Field of Classification Search
CPC .............. G06F 3/0421; G06K 9/0004; G06K 9/00046; G06K 9/0008; H01L 51/44;
(Continued)

(56) References Cited

U.S. PATENT DOCUMENTS

2010/0073530 A1* 3/2010 Ng .................... H04N 5/374
348/294
2017/0124370 A1* 5/2017 He ..................... G06K 9/00892
(Continued)

FOREIGN PATENT DOCUMENTS

CN     106022325     10/2016
CN     107004130     8/2017
(Continued)

OTHER PUBLICATIONS

International Preliminary Report on Patentability from PCT/US2019/040355, dated Jan. 29, 2021, 43 pages.
(Continued)

*Primary Examiner* — Premal R Patel
(74) *Attorney, Agent, or Firm* — BAKERHOSTETLER (57) ABSTRACT

An apparatus for fingerprint sensing includes a touch-display layer covered by a transparent layer. The touch-display layer can emit light to illuminate a finger surface touching the transparent layer. The touch-display layer is transparent to reflected light from the surface to underlying layers. The underlying layers include a collimator layer and a pixelated image sensor. The collimator layer can collimate the reflected light, and the pixelated image sensor can sense the collimated reflected light. The collimator can collimate the reflected light to enable a one-to-one imaging ratio between an area of the finger surface touching the transparent layer and an area of a corresponding image formed on the pixelated image sensor.

21 Claims, 7 Drawing Sheets

(51) Int. Cl.
*H10K 30/80* (2023.01)
*H10K 50/30* (2023.01)

(58) Field of Classification Search
CPC .............. H01L 51/5296; Y02E 10/549; G06V 40/1318; G06V 40/1359; G06V 40/1324
See application file for complete search history.

(56) References Cited

U.S. PATENT DOCUMENTS

| | | | |
|---|---|---|---|
| 2017/0220840 A1* | 8/2017 | Wickboldt | G06V 40/1335 |
| 2017/0270342 A1* | 9/2017 | He | G06V 40/1318 |
| 2018/0012069 A1* | 1/2018 | Chung | G06K 9/2036 |
| 2018/0225501 A1 | 8/2018 | Mienko et al. | |
| 2019/0354740 A1* | 11/2019 | Li | H01L 29/78633 |
| 2020/0342195 A1* | 10/2020 | Wu | G02B 27/30 |

FOREIGN PATENT DOCUMENTS

| | | |
|---|---|---|
| CN | 107580709 | 1/2018 |
| CN | 107748874 | 3/2018 |
| CN | 107844767 | 3/2018 |
| CN | 108496180 | 9/2018 |
| CN | 108509821 | 9/2018 |
| JP | 2018-506806 A | 3/2018 |
| KR | 2018-0005588 A | 1/2018 |

OTHER PUBLICATIONS

Written Opinion from PCT/US2019/040355, dated Sep. 7, 2020, 5 pages.
Indian Office Action from Indian Patent Application No. 202117007426, dated Jan. 19, 2022, 8 pages.
Korean Office Action from Korean Patent Application No. 10-2021-7006059, dated Jan. 16, 2023, 16 pages including English language translation.
Korean Notice of Allowance from Korean Patent Application No. 10-2021-7006059, dated Jul. 28, 2023, 6 pages including machine-generated English language translation.

* cited by examiner

UNDER-DISPLAY OPTICAL FINGERPRINT SENSOR WITH NFV COLLIMATOR AND TFT/ORGANIC IMAGER

CROSS-REFERENCE TO RELATED APPLICATIONS

This application claims the benefit of priority under 35 U.S.C. § 119 from U.S. Provisional Patent Application 62/737,818 filed Sep. 27, 2018, which is incorporated herein by reference in its entirety.

TECHNICAL FIELD

The present description relates generally to sensor technology and, more particularly, to an under-display optical fingerprint sensor with narrow field-of-view (NFV) collimator and a thin-film transistor (TFT)-based organic imager.

BACKGROUND

Fingerprint sensing and matching is widely used as a reliable technique for personal identification or verification. In particular, a common approach to fingerprint identification involves scanning a sample fingerprint of a person to form an image and storing the image as a unique characteristic of the person. The characteristics of the sample fingerprint may be compared to information associated with reference fingerprints already stored in a database to determine proper identification of the person, such as for verification purposes.

An optical fingerprint sensor may be particularly advantageous for verification and/or authentication in an electronic device and, more particularly, a portable device, for example, a portable communication device. The optical fingerprint sensor may be carried by the housing of a portable communication device, for example, and may be sized to sense a fingerprint from a single finger. Where an optical fingerprint sensor is integrated into an electronic device or host device, for example, as noted above, the authentication can be performed quickly, for example, by a processor of the host device. The challenges facing the optical fingerprint sensor include consistency in performance over time, as the glass-air interfaces are not stable enough for small area matching. On the other hand, the large-area sensors using complementary metal-oxide-semiconductor (CMOS) are not cost effective. Separation of different reflection rays at various angles is another challenge, as many illumination patterns have to be used to separate the reflection rays, which leads to a long (e.g., a few seconds) image capture time.

BRIEF DESCRIPTION OF THE DRAWINGS

Certain features of the subject technology are set forth in the appended claims. However, for purposes of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute part of the detailed description. The detailed description includes specific details for the purpose of providing a thorough understanding of the subject technology. However, the subject technology is not limited to the specific details set forth herein and may be practiced without one or more of the specific details. In some instances, structures and components are shown in a block diagram form in order to avoid obscuring the concepts of the subject technology.

The subject technology is directed to an apparatus for fingerprint sensing with a narrow field-of view (NFV) collimator and an organic imager. The apparatus includes a touch-display layer, a collimator layer and a pixelated image sensor. The touch-display layer can be an organic light-emitting diode (OLED) display that is covered by a transparent layer (e.g., a cover glass layer) and can emit light to illuminate a surface touching the transparent layer and allows transmission of reflected light from the surface to underlying layers including the collimator layer and the organic imager. The collimator layer can collimate the reflected light, and the organic imager is a pixelated image sensor that can sense the collimated reflected light.

In one or more implementations, the collimator collimates the reflected light to enable a one-to-one imaging ratio between an area of the finger surface touching the transparent layer and an area of a corresponding image formed on the pixelated image sensor. In other words, the reflected light reaching a pixel of the organic imager through the collimator layer is transmitted through an area of the organic imager approximately equal to an area of the pixel. The pixelated image sensor can be a thin-film transistor (TFT)-based organic imager. In some embodiments, the collimator layer is a fiber-optics plate made of a collection of optical fiber films bundled with an opaque separator material. In one or more implementations, the collimator layer is a micro-aperture plate including transparent glass or resin embedded in an opaque glass or resin material. The collimator layer of the subject technology can achieve a NFV of approximately +/−3 degrees and a transmission within a range of about −6 dB to 0 dB.

In some implementations, a micro-lens layer is formed on top of the micro aperture plate to separate angled illumination reflections. A total feature signal-to-noise ratio (FSNR) value of the touch-display layer and the underlying layers amounts to more than about 12 dB. The surface touching the transparent layer is a surface of a human finger including ridges and valleys, and the collimator layer's purpose is to separate weak reflections resulting from angled illumination of walls of valleys.

Figure 1A:
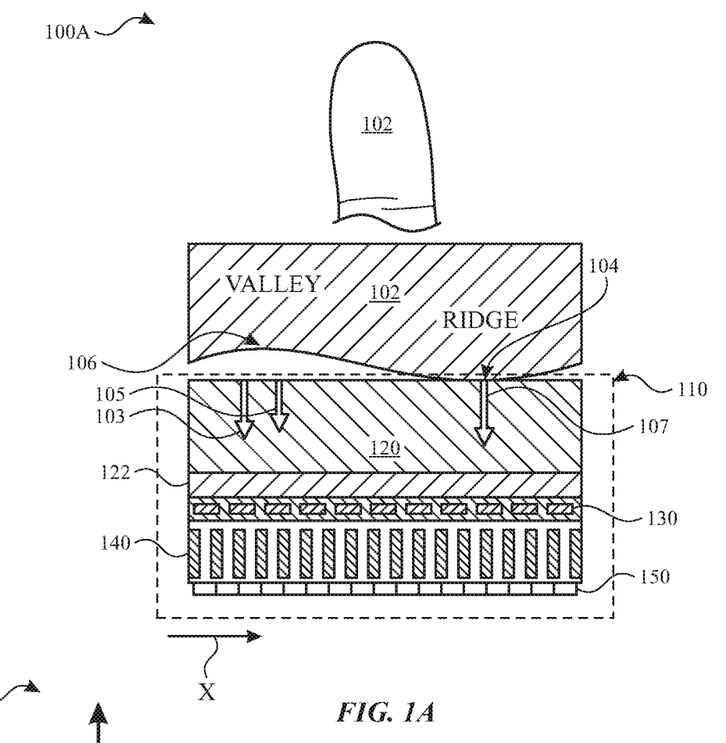
FIGS. 1A-1B are diagrams illustrating an example of an under-display optical fingerprint sensor and a corresponding signal-level chart, in accordance with one or more aspects of the subject technology.
Figure 1B:
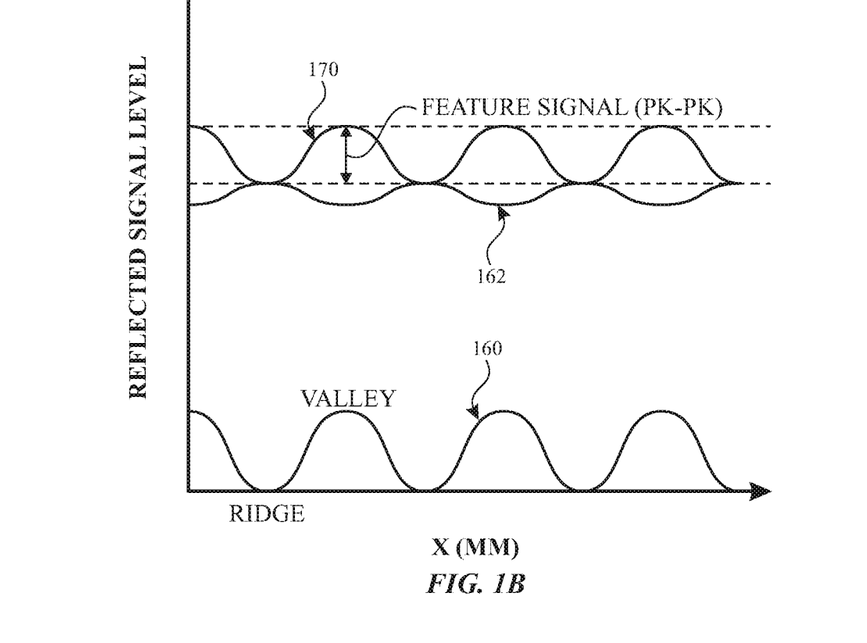

FIGS. 1A-1B are diagrams illustrating an example of an under-display optical fingerprint sensor 110 and a corresponding signal-level chart 100B, in accordance with one or more aspects of the subject technology. The cross-sectional view of the under-display optical fingerprint sensor 110 (hereinafter "fingerprint sensor 110") is shown in diagram 100A, which also shows a human finger 102 (hereinafter "finger 102"). The touch surface of the finger 102 is referred to as a "touching surface" or just a "surface" touching the fingerprint sensor 110.

The fingerprint sensor 110 includes a transparent layer 120, an optical adhesive layer 122, a touch-display layer 130, a collimator layer 140 and an image sensor 150. The transparent layer 120 can be a glass cover or any other transparent layer that is used to protect the touch-display layer 130. The transparent layer 120 can be transparent to lights within the visible spectrum. In some implementations, the transparent layer 120 can be further transparent to ultra-violet (UV) and/or infra-red light (IR) as well. The transparent layer 120 can be attached to the touch-display layer 130 via the optical adhesive layer 122.

The touch-display layer 130 is transparent to reflected light from the touching surface to underlying layers and can be made of an organic light-emitting diode (OLED). An OLED includes an emissive electroluminescent layer, which is a film of an organic compound that emits light in response to an electric current. This layer of organic compound is situated between two electrodes, of which at least one is a transparent electrode, for example, made of indium-tin oxide (ITO). OLEDs are employed to create digital displays in a variety of devices and/or systems such as television screens, computer monitors, portable communication devices such as mobile phones, handheld game consoles and other electronic displays. The touch-display layer 130 can emit light (e.g., visible light) to illuminate the touching surface.

The collimator layer 140 is an important component of the fingerprint sensor 110, which is of particular interest in the subject technology and will be discussed in more detail herein. The collimator layer 140 is configured so that it can provide a one-to-one imaging ratio between an area of the finger surface touching the transparent layer 120 and an area of a corresponding image formed on the image sensor 150. The image sensor 150 is a TFT-based organic imager. A TFT-based organic imager is an organic imager that is fabricated on a TFT-based electronic readout backplane. The organic imager can be an array of organic semiconductor photodiodes. The organic semiconductor photodiodes can be made of, for example, a stack of evaporated ultrathin (e.g., <100 nm) films of an organic substance such as chloro-boron (e.g., SubPc/C-60), which is sensitive in a wavelength range of about 300 nm to 650 nm.

The finger 102 is considered to be a normal (e.g., not wet or dry) finger and when touching the fingerprint sensor 110, presents a ridge region 104 and a valley region 106 to the transparent layer 120. In the valley region 106, the light emitted by touch-display layer 130 can be reflected from a glass-air interface at a top surface of the transparent layer 120 as a specular reflection component 103 or enter the finger and be reflected back at some point within the finger tissue as a remission reflection component 105. In the valley region 106, there may also be wall reflections from the skin of the finger 102 from angle-illumination rays; this component is typically weak compared to the other components. In the ridge region 104, the light emitted by touch-display layer 130 can be reflected from the touching surface of the finger 102 as a remission reflection component 107. When the finger is wet, the space between the top surface of the transparent layer 120 and the valley region 106 of the finger 102 may be filled with sweat resulting in an additional specular reflection component (not shown for simplicity). When the finger is dry, on the other hand, additional specular reflection can be produced in the ridge region 104.

The chart 100B shown in FIG. 1B depicts plots 160, 162 and 170. The plot 160 depicts variation as a function distance of the specular reflection component 103 of FIG. 1A. The distance can be measured from a reference point on the image sensor 150 along the axis X shown in FIG. 1A. The specular reflection signal of plot 160 peaks at X values corresponding to the valley region 106 and is minimum (e.g., zero) at X values corresponding to the ridge region 104. The plot 162 corresponds to the remission reflection components (e.g., 105 and 107). The remission reflection signal of plot 162 has nonzero values everywhere and peaks at X values corresponding to the ridge region 104. The total reflection signal of plot 170 is the sum of the specular reflection signal and the remission reflection signal of plots 160 and 162, respectively. An important feature of the total reflection signal of plot 170 is a feature signal parameter, which is defined as the peak-to-peak amplitude value of the total reflection signal of plot 170.

Figure 2A:
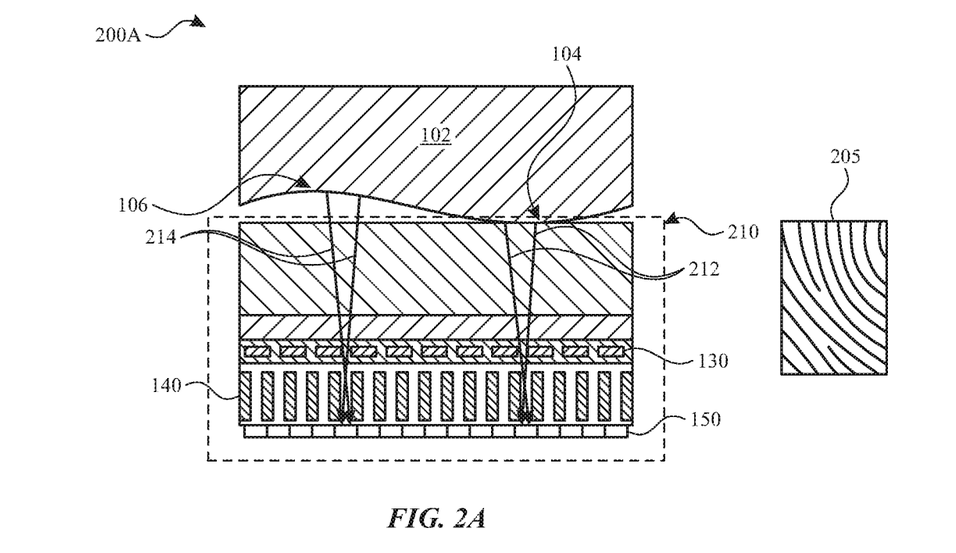
FIGS. 2A-2B are diagrams illustrating an example of an under-display optical fingerprint sensor and a corresponding signal-level chart, in accordance with one or more aspects of the subject technology.
Figure 2B:
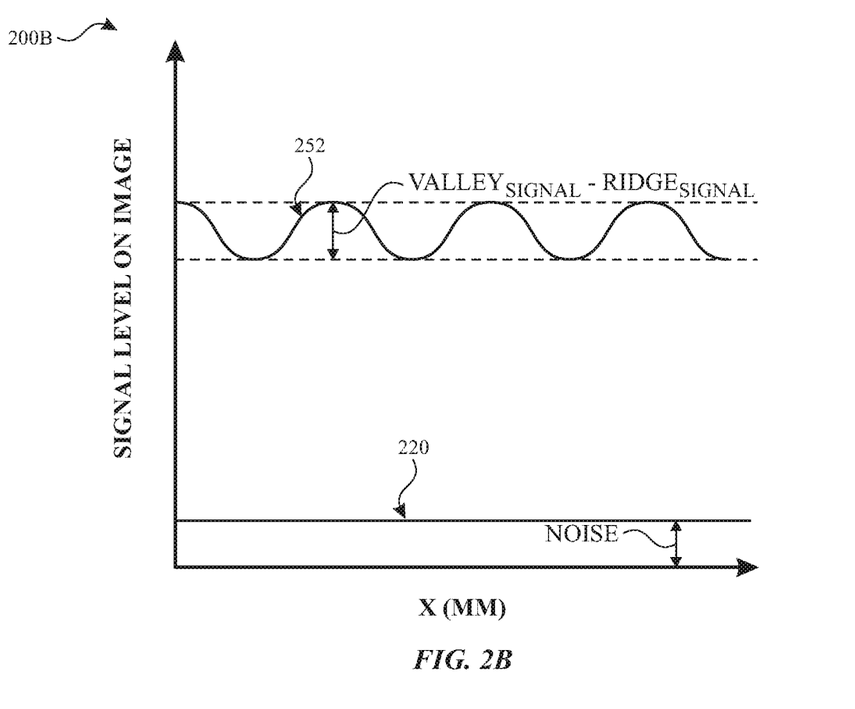

FIGS. 2A-2B are diagrams illustrating an example of a fingerprint sensor 210 and a corresponding signal-level chart 200B, in accordance with one or more aspects of the subject technology. The fingerprint sensor 210 shown in the cross-sectional view 200A of FIG. 2A is similar to the fingerprint sensor 110 of FIG. 1A and includes the touch-display layer 130, the collimator layer 140 and the image sensor 150. The collimator layer 140 is also referred to as a narrow field-of-view filter (NFVF). This is because the collimator layer 140 allows a narrow beam of light to pass through and reach the image sensor 150. For example, the collimator layer 140 can be made to have a one-to-one image ratio between the touch-display layer 130 and the image sensor 150. For the one-to-one image ratio, the image of a distance (d) on the touch-display layer 130 would be the same size (d) on the image sensor 150. FIG. 2A shows filtering of reflection rays 212 and 214 by the collimator layer 140. The reflection rays 212 and 214 are, respectively, from the ridge region 104 and the valley region 106 of the finger 102.

The chart 200B of FIG. 2B shows results of an analysis of an example image 205 of a fingerprint provided by the fingerprint sensor 110. The chart 200B depicts a plot 220 of a noise level and a plot 252 of the total reflection signal. On the total reflection signal of the plot 220, the peak-to-peak value represents a difference between a valley signal (Valley$_{signal}$) and a ridge signal (Ridge$_{signal}$). The Valley$_{signal}$ corresponds to the reflection rays 214 of FIG. 2A and the Ridge$_{signal}$ corresponds to the reflection rays 212 of FIG. 2A. The total reflection signal of plot 252 and the noise level depicted by the plot 220 can be represented by an FSNR parameter defined as:

$$\text{FSNR} = 20 \log(\text{Valley}_{signal} - \text{Ridge}_{signal})/\text{Noise} \quad \text{(Eq. 1)}$$

where Noise is the noise level depicted by the plot 220. An example value of the FSNR parameter for a normal finger can be about 20 dB, but in general, the value of the FSNR parameter can be more than 12 dB. The example 20 dB value is for a link budget based on example parameter values including a specular reflection level of about −30 dB, a remission reflection level of about −9 dB, a finger thinness and display blurring of about −15 dB, an NFVF transmission of about −6 dB, a display transmission of about −20 dB, a display illumination intensity of about +16.5 dB and an electronic noise of about −6 dB.

Figure 3:
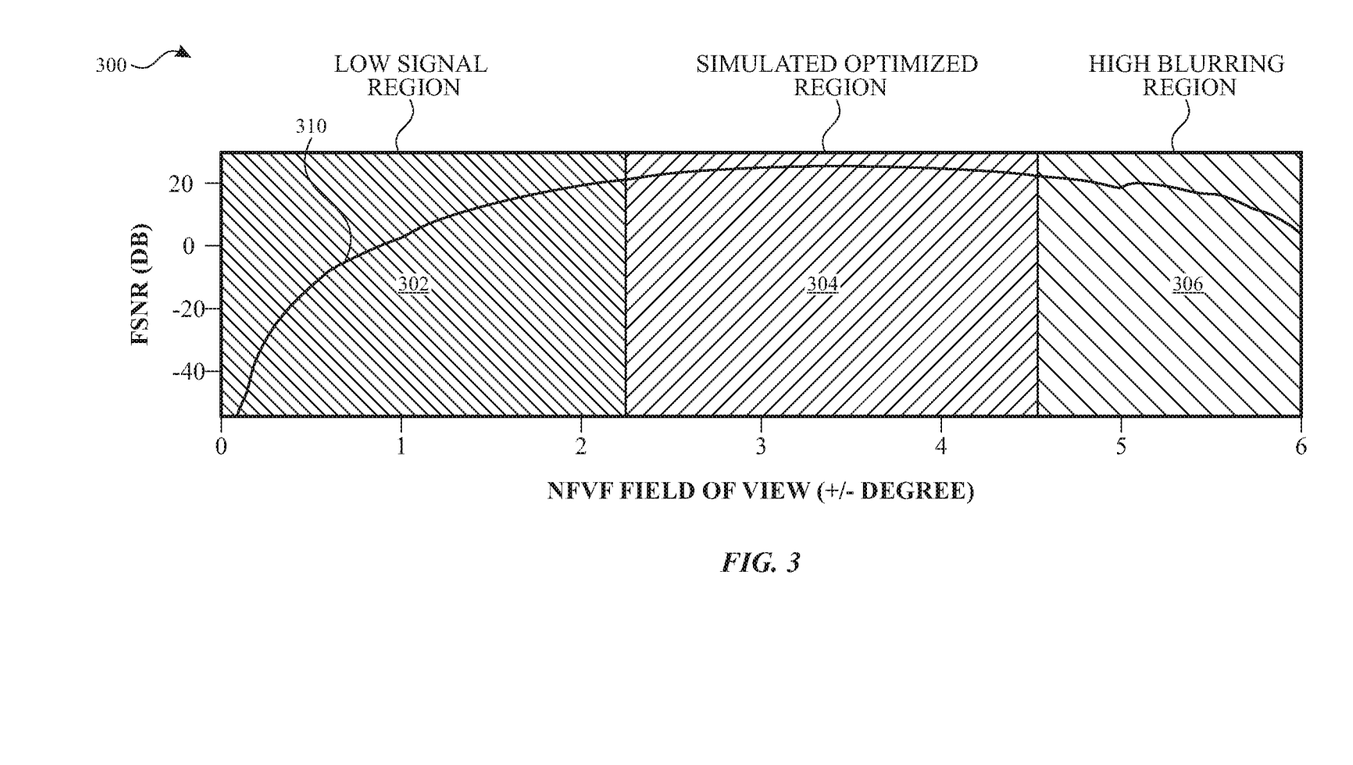
FIG. 3 is a chart illustrating a signal-to-noise characteristic of an example narrow field-of-view filter (NFVF), in accordance with one or more aspects of the subject technology.

FIG. 3 is a chart illustrating a signal-to noise characteristic 300 of an example NFVF, in accordance with one or more aspects of the subject technology. The NFVF is a collimator of the subject technology, for example, the collimator layer 140 of FIG. 2A. The signal-to noise characteristic 300 shown in FIG. 3 depicts an example of the FSNR parameter expressed in the (Eq. 1) above and may corresponds to a normal finger (not dry and not wet). The numbers shown on the vertical and horizontal axes of the chart are merely example values of FSNR and NFVF values, respectively, and may depend on a number of factors including material, thickness and geometry of the architecture of the collimator layer and other parameters. The signal-to-noise characteristic 300 includes three different regions 302, 304 and 306. The regions 302 and 306 are a low-signal level region and a high-blurring region, respectively. In other words, in the region 302 the field-of-view of the NFVF is less than about 2.2 degrees, which is less than sufficient for a reasonable signal level. In the region 306, however, the field-of-view of the NFVF is larger than about 4.6 degrees, which allows for high blurring. Based on simulation results, the region 304 is the optimized operation region, for which the NFVF has an FSNR parameter more than 12 dB (e.g., 20 dB) and a field-of-view within a range of about 2.2-4.6 degrees. As mentioned above, it is understood that the value of the field-of-view can depend on many factors including, thickness, material and geometry of the architecture, however, it may be possible to optimize field-of-view to achieve an appropriate resolution (e.g., 50 µm) on the touch plain or the image plain. In some implementations, dry finger conditions may cause a notch in the FSNR curve that has to be considered for an optimized NFVF field-of-view selection.

Figure 4A:
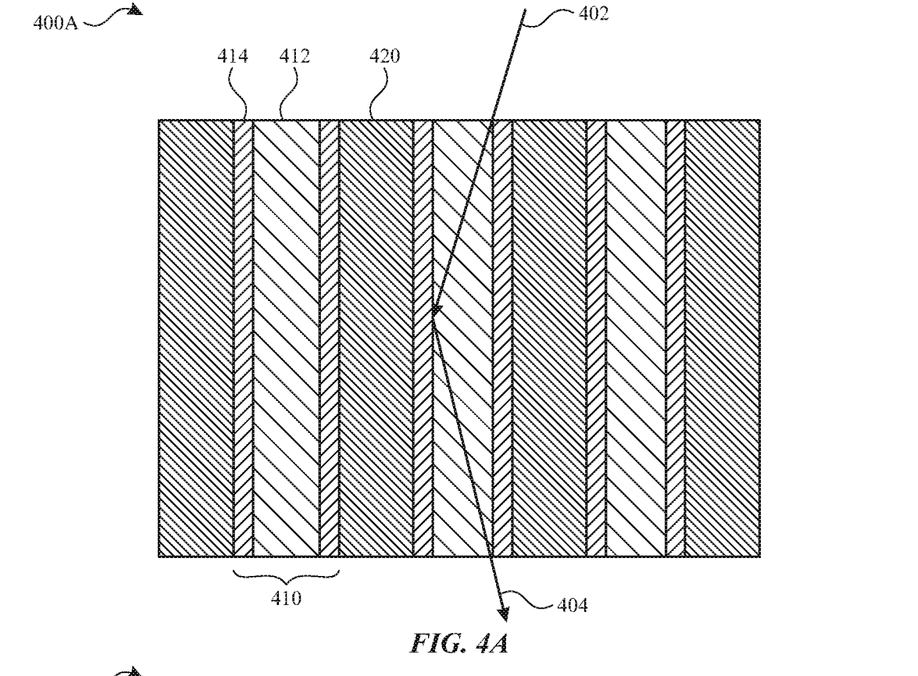
FIGS. 4A-4B are diagrams illustrating cross-sectional views of examples of a fiber-optics plate and a micro-aperture array.
Figure 4B:
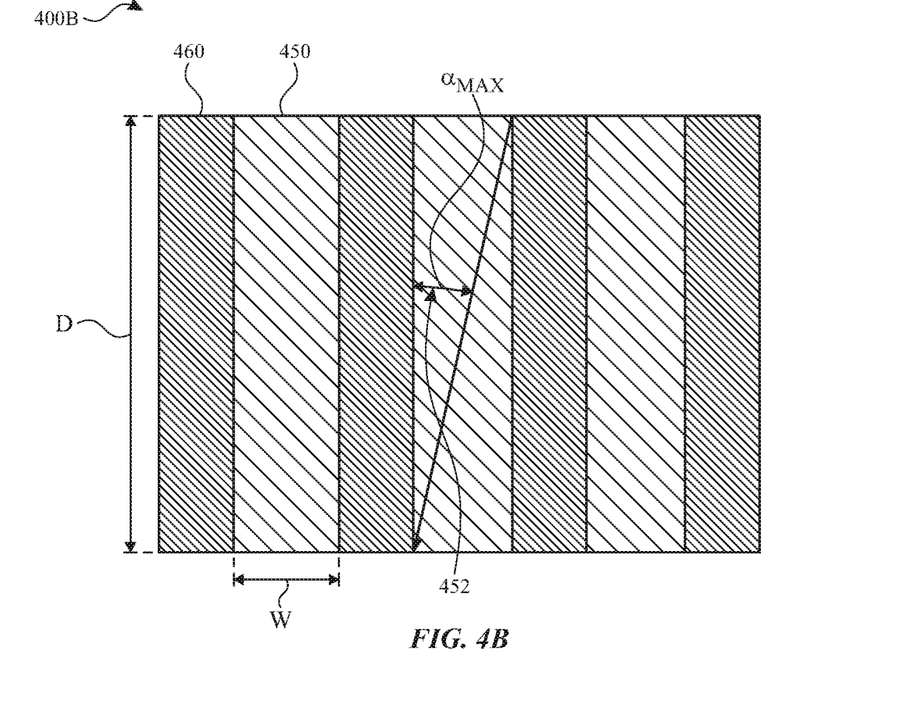

FIGS. 4A-4B are diagrams illustrating cross-sectional views of examples of a fiber-optics plate 400A and a micro-aperture array 400B, respectively. The cross-sectional view of the fiber-optics plate 400A shown in FIG. 4A depicts a number of optical fiber sections 410 separated by filler sections 420 (e.g., opaque sections) that form the fiber-optics plate 400A. Each optical fiber section 410 includes a core region 412 and a clad region 414. An optical ray 402 entering the core region 412 can be reflected from the clad region 414. Only rays entering the core region at an angle α less than or equal to $α_{max}$ (cut-off angle), such as an optical ray 404, can exit the fiber-optics plate 400A. The value of the $α_{max}$ is expressed as:

$$α_{max} = \sin^{-1}[(n_{core}^2 - n_{cladding}^2)/n]$$ (Eq. 2)

where n is the index of refraction of the filler sections 420. The transmission at normal incidence of the fiber-optics plate 400A depends on the fill factor of the optical fiber section.

FIG. 4B shows the cross-sectional view of the micro-aperture array 400B. The micro-aperture array 400B is formed of an array of transparent regions 450 (e.g., micro-apertures) separated by opaque regions 460, which can be made of glass or resin material. The value of the maximum angle 452 ($α_{max}$) for the micro-aperture array 400B is expressed as:

$$α_{max} = \tan^{-1}(W/D)$$ (Eq. 3)

Where W is the width of the transparent region 450 and D is the thickness of the micro-aperture array 400B. The transmission at normal incidence of the micro-aperture array 400B depends on the fill factor of the micro apertures (e.g., transparent regions 450). For the fiber-optics plate 400A and the micro-aperture array 400B, to achieve a field-of-view (FOV) of about +/−2.8 degrees, a thickness (D) has to be more than about 350 µm. The subject technology can reduce this thickness drastically, as described herein.

Figure 5A:
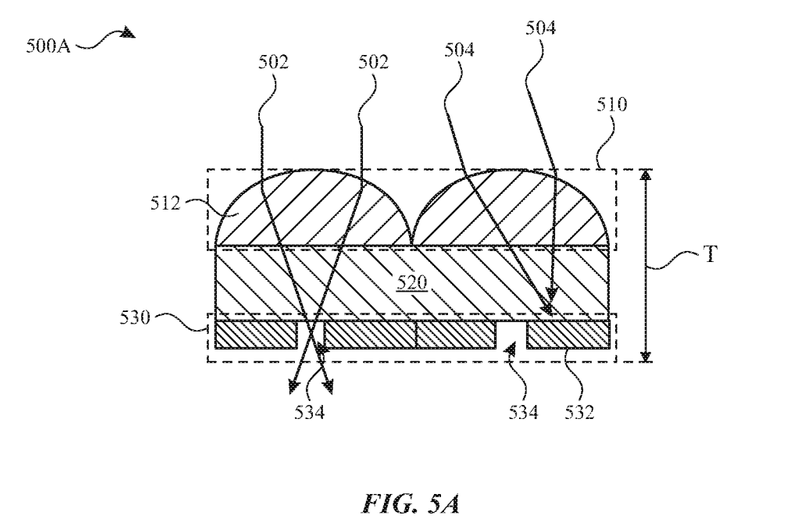
FIGS. 5A through 5C are a cross-sectional view of an example micro-lens array structure, an example array configuration and a corresponding chart, in accordance with one or more aspects of the subject technology.
Figure 5B:
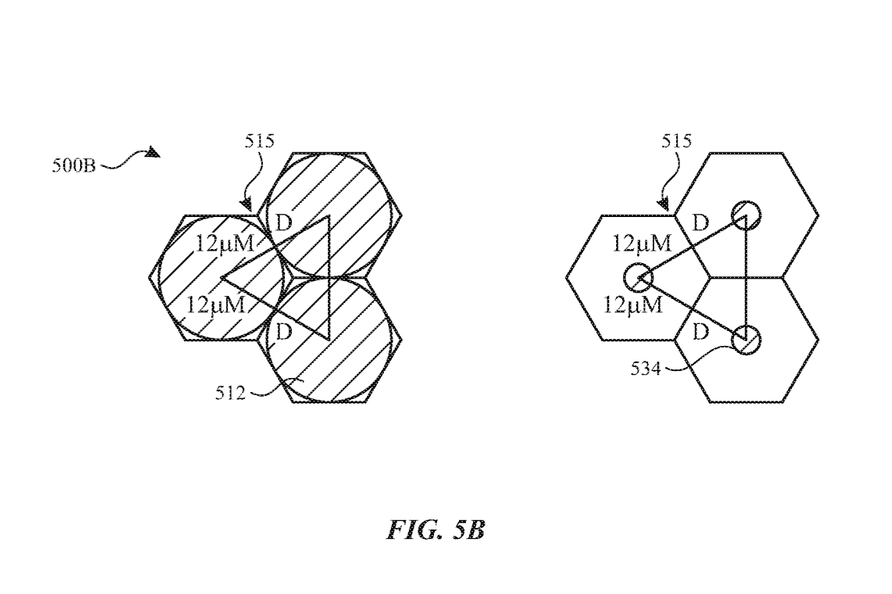
Figure 5C:
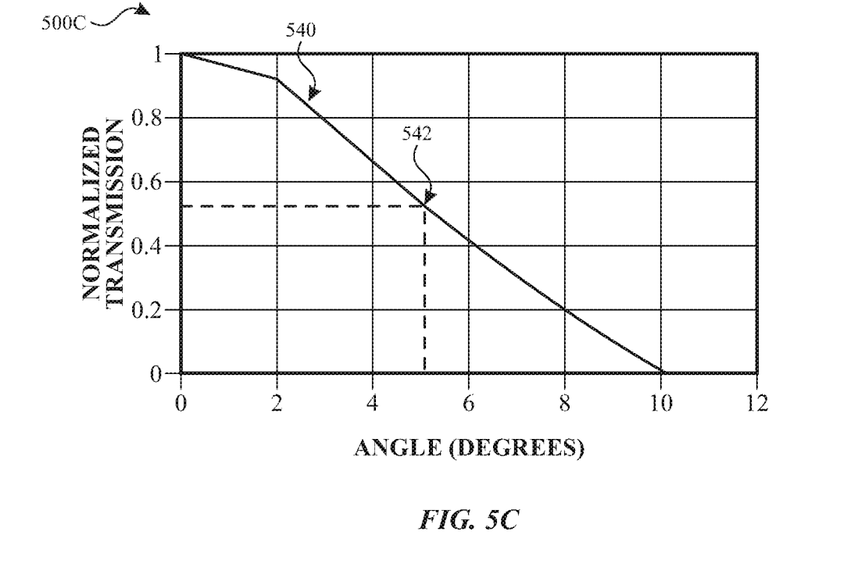

FIGS. 5A through 5C are a cross-sectional view of an example micro-lens array structure 500A, an example array configuration 500B and a corresponding chart 500C, in accordance with one or more aspects of the subject technology. The cross-sectional view of the micro-lens array structure 500A of FIG. 5A shows a micro-lens layer 510 and an aperture layer 530 coupled via a transparent interface layer 520. The micro-lens layer 510 includes an array of micro-lenses (e.g., spherical micro-lenses) 512 made of glass or a transparent polymer.

In some implementations, the micro-lens layer 510 may be assembled on top of the transparent interface layer 520 (e.g., a plastic substrate) and then be placed over the aperture layer 530, which can be separately formed (e.g., deposited) on a corresponding substrate (e.g., a flex). The aperture layer 530 includes opaque sections 532 and apertures 534 (e.g., openings). The aperture layer 530 can be formed using a suitable deposition technique, and the apertures 534 can be created in the deposited opaque layer using, for example, a lithographic technique such as optical lithography technique. In some implementations, a total thickness (T) of the micro-lens array structure 500A of the subject technology can be about 100 µm, which is significantly smaller than the thickness of the fiber-optics plate 400A and the micro-aperture array 400B described above with respect to FIGS. 4A and 4B. Normal rays 502 can be converged by the micro-lenses 512 and be transmitted through the apertures 534. However, oblique rays 504 are converged and then filtered by the opaque sections 532 of the aperture layer 530. This feature of optimizing transmission of the normal rays 502 by micro-lens array structure 500A is an important aspect of micro-lens array structure 500A. For example, the micro-lens array structure 500A can filter out reflection from angled illumination of walls of the touching surface in the valley region (e.g., 106 of FIG. 1A).

The array configuration 500B shown in FIG. 5B is a top view and depicts a hexagonal configuration of the micro-lens array 510, where the micro-lenses 512 are located in a hexagon 515 of the hexagonal configuration. In some implementations, an array pitch represented by a distance (d) between the centers of the micro-lenses 512 can be about 12 µm. Also shown in FIG. 5B are the top views of the apertures 534 of the aperture layer 530 of FIG. 5A.

The chart 500C shown in FIG. 5C depicts a plot 540 of a normalized transmission versus angle (in degrees) of incidence of the light rays (e.g., 504). The normalized transmission shown by the plot 540 corresponds to an air interface and a total thickness (T) of about 105 µm. The point 542 on the plot 540 signifies a viewing angle of about +/−5 degrees, which is associated with a transmission of about 0.5 (e.g., 50% transmission).

Figure 6:
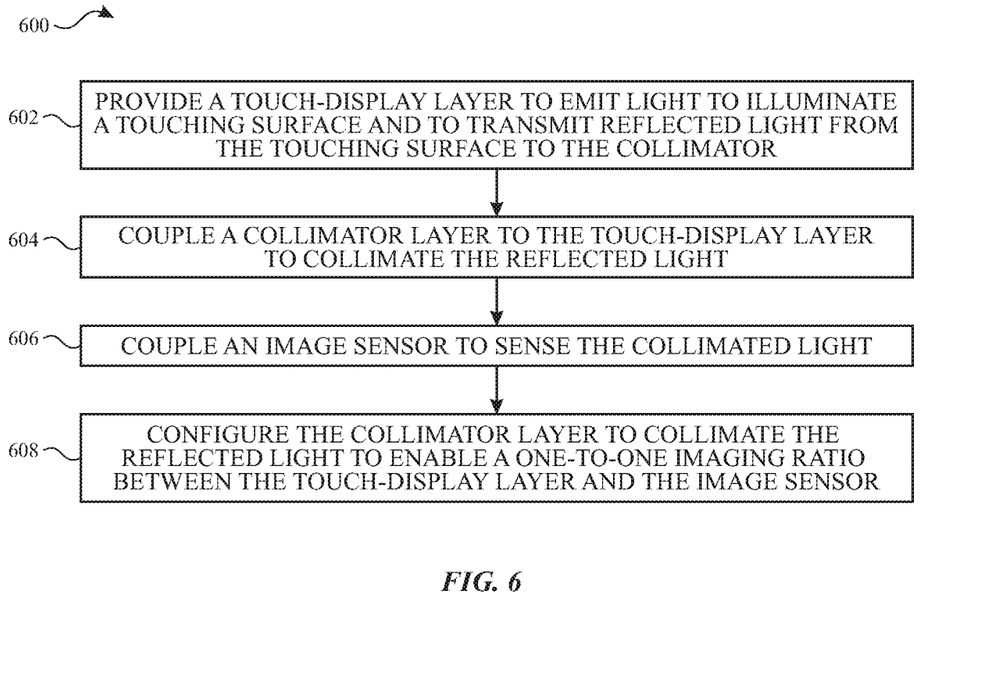
FIG. 6 is a flow diagram illustrating an example method for providing an under-display optical fingerprint sensor, in accordance with one or more aspects of the subject technology.

FIG. 6 is a flow diagram illustrating an example method 600 for providing a fingerprint sensor 110 of FIG. 1A, in accordance with one or more aspects of the subject technology. The method 600 includes providing a touch-display layer (e.g., 130 of FIG. 1A) to emit light to illuminate a touching surface (e.g., surface of 102 of FIG. 1A) and to transmit reflected light (e.g., 212 and 214 of FIG. 2A) from the touching surface to a collimator layer (e.g., 140 of FIG. 1A) (602). The method 600 further includes coupling the collimator layer to the touch-display layer to collimate the reflected light (604), and coupling an image sensor (e.g., 150 of FIG. 1A) to sense the collimated light (606). The collimator layer is configured to collimate the reflected light to enable a one-to-one imaging ratio between an area of the finger surface touching the transparent layer and an area of a corresponding image formed on the image sensor (608).

Figure 7:
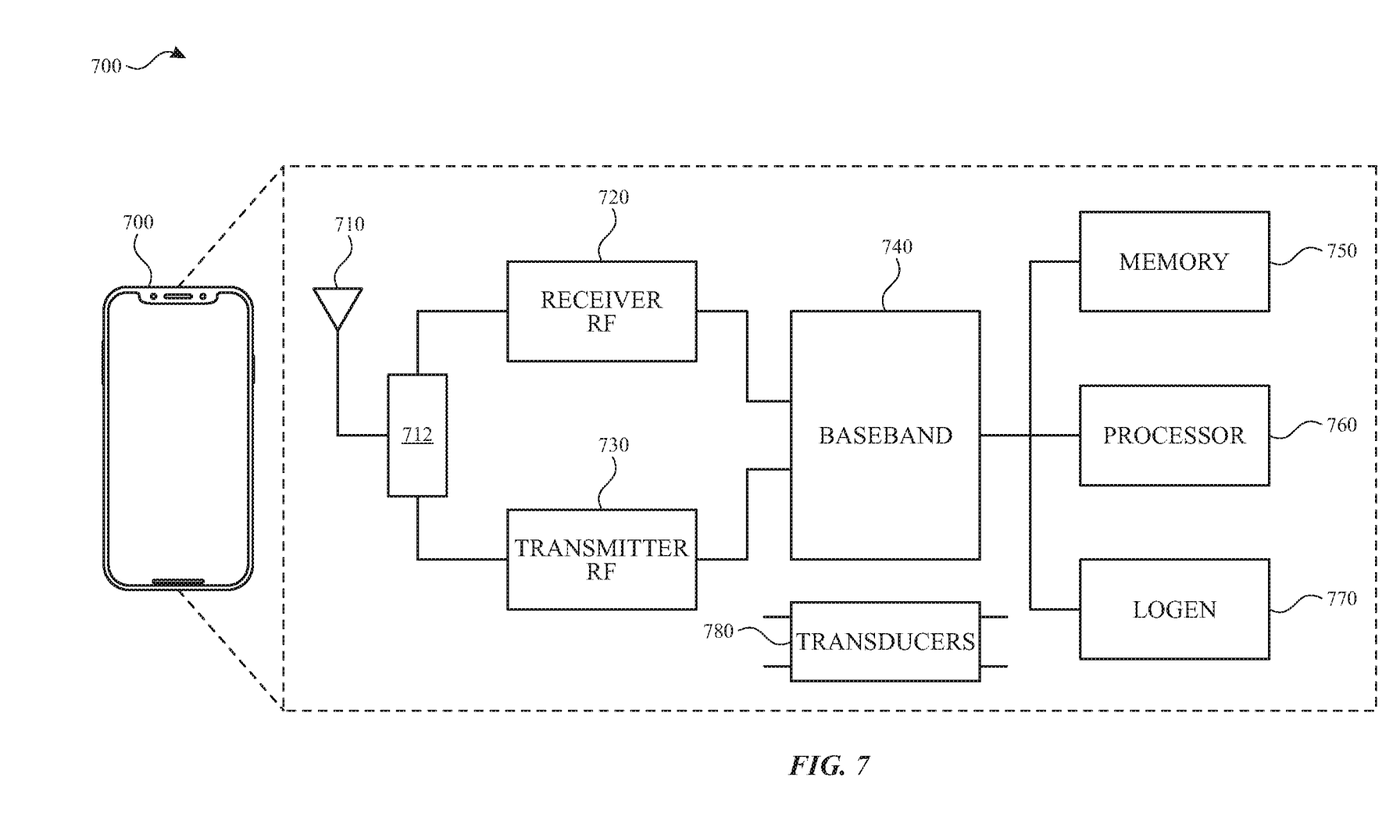
FIG. 7 is a block diagram illustrating a wireless communication device, within which one or more aspects of the subject technology can be implemented.

FIG. 7 is a block diagram illustrating a wireless communication device, within which one or more aspects of the subject technology can be implemented. In one or more implementations, the wireless communication device 700 can be a smart phone or a smart watch that hosts an apparatus of the subject technology including an under-display optical fingerprint sensor. The wireless communication device 700 may comprise a radio-frequency (RF) antenna 710, duplexer 712, a receiver 720, a transmitter 730, a baseband processing module 740, a memory 750, a processor 760, a local oscillator generator (LOGEN) 770, and one or more transducers 780. In various embodiments of the subject technology, one or more of the blocks represented in FIG. 7 may be integrated on one or more semiconductor substrates. For example, the blocks 720-770 may be realized in a single chip or a single system on a chip, or may be realized in a multichip chipset.

The receiver 720 may comprise suitable logic circuitry and/or code that may be operable to receive and process signals from the RF antenna 710. The receiver 720 may, for example, be operable to amplify and/or down-convert received wireless signals. In various embodiments of the subject technology, the receiver 720 may be operable to cancel noise in received signals and may be linear over a wide range of frequencies. In this manner, the receiver 720 may be suitable for receiving signals in accordance with a variety of wireless standards, Wi-Fi, WiMAX, Bluetooth, and various cellular standards. In various embodiments of the subject technology, the receiver 720 may not use any saw-tooth acoustic wave (SAW) filters and few or no off-chip discrete components such as large capacitors and inductors.

The transmitter 730 may comprise suitable logic circuitry and/or code that may be operable to process and transmit signals from the RF antenna 710. The transmitter 730 may, for example, be operable to up-convert baseband signals to RF signals and amplify RF signals. In various embodiments of the subject technology, the transmitter 730 may be operable to up-convert and amplify baseband signals processed in accordance with a variety of wireless standards. Examples of such standards may include Wi-Fi, WiMAX, Bluetooth, and various cellular standards. In various embodiments of the subject technology, the transmitter 730 may be operable to provide signals for further amplification by one or more power amplifiers.

The duplexer 712 may provide isolation in the transmit band to avoid saturation of the receiver 720 or damaging parts of the receiver 720, and to relax one or more design requirements of the receiver 720. Furthermore, the duplexer 712 may attenuate the noise in the receive band. The duplexer may be operable in multiple frequency bands of various wireless standards.

The baseband processing module 740 may comprise suitable logic, circuitry, interfaces, and/or code that may be operable to perform processing of baseband signals. The baseband processing module 740 may, for example, analyze received signals and generate control and/or feedback signals for configuring various components of the wireless communication device 700, such as the receiver 720. The baseband processing module 740 may be operable to encode, decode, transcode, modulate, demodulate, encrypt, decrypt, scramble, descramble, and/or otherwise process data in accordance with one or more wireless standards.

The processor 760 may comprise suitable logic, circuitry, and/or code that may enable processing data and/or controlling operations of the wireless communication device 700. In this regard, the processor 760 may be enabled to provide control signals to various other portions of the wireless communication device 700. The processor 760 may also control transfer of data between various portions of the wireless communication device 700. Additionally, the processor 760 may enable implementation of an operating system or otherwise execute code to manage operations of the wireless communication device 700. In one or more implementations, the processor 760 can be used to process signals of the under-display fingerprint sensor of the subject technology (e.g., signals from the image sensor 150 of FIG. 1A) to generate a fingerprint image and compare the fingerprint image with a number of reference finger prints stored in a database to identify and/or authenticate a person associated with the finger print.

The memory 750 may comprise suitable logic, circuitry, and/or code that may enable storage of various types of information such as received data, generated data, code, and/or configuration information. The memory 750 may comprise, for example, RAM, ROM, flash, and/or magnetic storage. In various embodiments of the subject technology, information stored in the memory 750 may be utilized for configuring the receiver 720 and/or the baseband processing module 740. In some implementations, the memory 750 may store image information from processed and/or unprocessed fingerprint images of the under-display fingerprint sensor of the subject technology. The memory 750 may also include one or more databases of reference finger prints that can be used to identify and/or authenticate a person associated with the finger print.

The local oscillator generator (LOGEN) 770 may comprise suitable logic, circuitry, interfaces, and/or code that may be operable to generate one or more oscillating signals of one or more frequencies. The LOGEN 770 may be operable to generate digital and/or analog signals. In this manner, the LOGEN 770 may be operable to generate one or more clock signals and/or sinusoidal signals. Characteristics of the oscillating signals such as the frequency and duty cycle may be determined based on one or more control signals from, for example, the processor 760 and/or the baseband processing module 740.

In operation, the processor 760 may configure the various components of the wireless communication device 700 based on a wireless standard according to which it is desired to receive signals. Wireless signals may be received via the RF antenna 710, amplified, and down-converted by the receiver 720. The baseband processing module 740 may perform noise estimation and/or noise cancellation, decoding, and/or demodulation of the baseband signals. In this manner, information in the received signal may be recovered and utilized appropriately. For example, the information may be audio and/or video to be presented to a user of the wireless communication device, data to be stored to the memory 750, and/or information affecting and/or enabling operation of the wireless communication device 700. The baseband processing module 740 may modulate, encode, and perform other processing on audio, video, and/or control signals to be transmitted by the transmitter 730 in accordance with various wireless standards.

In one or more implementations, the transducers 780 may include the under-display fingerprint sensor of the subject technology (e.g., 110 of FIG. 1A). The under-display optical fingerprint sensor of the subject technology can be readily integrated into the wireless communication device 700, in particular, when the wireless communication device 700 is a smart mobile phone or a smart watch.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter genders (e.g., her and its) and vice versa. Headings and subheadings, if any, are used for convenience only and do not limit the subject disclosure.

The predicate words "configured to," "operable to," and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. An apparatus for fingerprint sensing, the apparatus comprising:
   a touch-display layer covered by a transparent layer and configured to emit light to illuminate a finger surface touching the transparent layer, wherein the touch-display layer is transparent to reflected light from the finger surface and allows the reflected light to reach underlying layers including:
      a collimator layer configured to collimate the reflected light; and
      a pixelated image sensor configured to sense the collimated reflected light,
   wherein the collimator layer comprises a micro-lens layer, the micro-lens layer comprising an array of micro-lenses with micro-lenses located in respective hexagons of a hexagonal architecture of the micro-lens layer.

2. The apparatus of claim 1, wherein the touch-display layer comprises an organic light-emitting diode (OILED) display.

3. The apparatus of claim 2, wherein the pixelated image sensor comprises a thin-film transistor (TFT)-based organic imager.

4. The apparatus of claim 1, wherein the collimator layer is configured to provide a narrow field-of-view within a range of +/−3 degrees.

5. The apparatus of claim 1, further comprising a micro-aperture plate including transparent glass embedded in an opaque glass, wherein the micro-lens layer is arranged on top of the micro-aperture plate and configured to separate angled-illumination reflections.

6. The apparatus of claim 1, wherein a transmission of the collimator layer is within a range of −6 dB to 0 dB.

7. The apparatus of claim 1, wherein a total feature signal-to-noise ratio (FSNR) value of the touch-display layer and the underlying layers amounts to more than 12 dB.

8. The apparatus of claim 1, wherein the finger surface touching the transparent layer includes ridges and valleys, and wherein the collimator layer is configured to separate reflections resulting from angled illumination of walls of valleys.

9. The apparatus of claim 1, wherein the collimator layer further comprises an aperture layer, wherein apertures of the aperture layer are aligned with the respective hexagons.

10. The apparatus of claim 9, wherein the collimator layer further comprises a transparent interface layer interposed between the micro-lens layer and the aperture layer.

11. A communication device comprising:
    a processor; and
    a fingerprint sensing apparatus comprising:
       a collimator layer disposed under a touch-display layer and configured to collimate light; and
       an image sensor configured to sense the collimated light,
    wherein the touch-display layer is configured to emit light to illuminate a touching surface and to transmit reflected light from the touching surface to the collimator layer, and wherein the collimator layer comprises a micro-lens layer, the micro-lens layer comprising an array of micro-lenses with different micro-lenses located in respective hexagons of a hexagonal architecture of the micro-lens layer.

12. The communication device of claim 11, wherein the touch-display layer is covered by a transparent layer, and wherein the touching surface comprises a surface of a finger touching the transparent layer, and wherein the touching surface includes ridges and valleys, and the collimator layer is configured to separate reflections resulting from angled illumination of walls of valleys.

13. The communication device of claim 11, wherein the image sensor comprises a pixelated-image sensor comprising a thin-film transistor (TFT)-based organic imager, and wherein the touch-display layer comprises an organic light-emitting diode (OLED) display.

14. The communication device of claim 11, wherein the collimator layer is configured to provide a narrow field-of-view within a range of +/−3 degrees.

15. The communication device of claim 11, wherein the fingerprint sensing apparatus further comprises a micro-aperture plate including transparent glass embedded in an opaque glass, wherein the micro-lens layer is arranged on top of the micro-aperture plate, and wherein the micro-lens layer is configured to separate angled illumination reflections.

16. The communication device of claim 11, wherein a total feature signal-to noise-ratio (FSNR) value of the touch-display layer and at least the collimator layer amounts to more than 12 dB.

17. The communication device of claim 16, wherein a transmission of the collimator layer is within a range of −6 dB to 0 dB.

18. A fingerprint sensing apparatus, the apparatus comprising:
  a touch-display layer configured to emit light to illuminate a touching surface and to transmit reflected light from the touching surface to a collimator layer;
  the collimator layer configured to collimate the reflected light; and
  an image sensor configured to sense the collimated reflected light,
  wherein the collimator layer comprises a micro-lens layer, the micro-lens layer comprising an array of micro-lenses with different micro-lenses located in respective hexagons of a hexagonal architecture of the micro-lens layer.

19. The apparatus of claim 18, wherein a transparent layer covers the touch-display layer, wherein the touching surface comprises a surface of a finger touching the transparent layer, and wherein the touching surface includes ridges and valleys, and the collimator layer is configured to separate reflections resulting from angled illumination of walls of valleys.

20. The apparatus of claim 18, wherein the collimator layer is configured to provide a narrow field-of-view within a range of +/−3 degrees, and wherein the collimator layer provides a transmission within a range of −6 dB to 0 dB.

21. The apparatus of claim 18, further comprising a micro-aperture plate including transparent glass embedded in an opaque glass, wherein the micro-lens layer is arranged on top of the micro-aperture plate, and wherein the micro-lens layer is configured to separate angled illumination reflections.

* * * * *

UNITED STATES PATENT AND TRADEMARK OFFICE
CERTIFICATE OF CORRECTION

| | |
|---|---|
| PATENT NO. | : 11,922,713 B2 |
| APPLICATION NO. | : 16/767887 |
| DATED | : March 5, 2024 |
| INVENTOR(S) | : Mohammad Yeke Yazdandoost et al. |

It is certified that error appears in the above-identified patent and that said Letters Patent is hereby corrected as shown below:

In the Claims

Column 10, Line 19 (Claim 2): "diode (OILED) display." should read --diode (OLED) display.--;

Column 10, Line 40 (Claim 8): "angled illumination" should read --angled-illumination--;

Column 11, Line 18 (Claim 16): "signal-to noise-ratio" should read --signal-to-noise ratio--.

Signed and Sealed this
Thirtieth Day of April, 2024

Katherine Kelly Vidal
*Director of the United States Patent and Trademark Office*